US 9,338,883 B2

(12) United States Patent
Watanabe

(10) Patent No.: US 9,338,883 B2
(45) Date of Patent: May 10, 2016

(54) PRINTED WIRING BOARD AND METHOD FOR MANUFACTURING PRINTED WIRING BOARD

(71) Applicant: IBIDEN CO., LTD., Ogaki (JP)

(72) Inventor: Satoshi Watanabe, Ogaki (JP)

(73) Assignee: IBIDEN CO., Ltd., Ogaki-shi (JP)

( * ) Notice: Subject to any disclaimer, the term of this patent is extended or adjusted under 35 U.S.C. 154(b) by 176 days.

(21) Appl. No.: 14/039,895

(22) Filed: Sep. 27, 2013

(65) Prior Publication Data

US 2014/0083746 A1    Mar. 27, 2014

(30) Foreign Application Priority Data

Sep. 27, 2012  (JP) ................................. 2012-213679

(51) Int. Cl.
  H05K 1/00    (2006.01)
  H05K 1/02    (2006.01)
  H05K 3/00    (2006.01)
  H01L 23/498  (2006.01)
  H05K 3/46    (2006.01)

(52) U.S. Cl.
  CPC ........ *H05K 1/0298* (2013.01); *H01L 23/49822* (2013.01); *H01L 23/49827* (2013.01); *H05K 1/0271* (2013.01); *H05K 3/00* (2013.01); *H05K 3/4602* (2013.01); *H05K 3/4655* (2013.01); *H01L 2924/0002* (2013.01); *H05K 2201/029* (2013.01); *H05K 2201/09136* (2013.01)

(58) Field of Classification Search
  CPC ... H05K 1/0298; H05K 1/115; H05K 1/0366; H05K 3/00; H05K 1/0271; H05K 3/4602; H05K 3/4655; H01L 23/49827; H01L 23/49822
  See application file for complete search history.

(56) References Cited

U.S. PATENT DOCUMENTS

| 2007/0025091 | A1* | 2/2007 | Shimada et al. ............. 361/750 |
| 2008/0107863 | A1* | 5/2008 | Ikeda et al. .................. 428/137 |
| 2009/0174065 | A1* | 7/2009 | Hayashi et al. .............. 257/712 |
| 2009/0302462 | A1* | 12/2009 | Hosomi et al. ................ 257/734 |
| 2010/0163297 | A1* | 7/2010 | Kajihara ...................... 174/264 |

FOREIGN PATENT DOCUMENTS

| JP | 2007-176169 A | 7/2007 |
| JP | 2008-258335 A | 10/2008 |
| JP | 2009-260123 A | 11/2009 |
| JP | 2012-009606 A | 1/2012 |

* cited by examiner

*Primary Examiner* — Steven T Sawyer
(74) *Attorney, Agent, or Firm* — Oblon, McClelland, Maier & Neustadt, L.L.P.

(57) ABSTRACT

A printed wiring board includes multiple insulating layers laminated on each other and each including resin and core, the insulating layers having first-surface sides and second-surface sides on the opposite side, respectively, and including multiple first insulating and second insulating layers, multiple first-surface-side conductive layers formed on the first-surface sides of the first insulating layers, respectively, multiple second-surface-side conductive layers formed on the second-surface sides of the second insulating layers, respectively. The insulating layers include one or more insulating layer having the core positioned such that the core is shifted toward the first-surface side from the center in the thickness direction, the insulating layers include a central insulating layer positioned in the center of the insulating layers, and the first-surface-side and second-surface-side conductive layers are formed such that the first-surface side conductive layers have the total area which is set smaller than the total area of the second-surface-side conductive layers.

20 Claims, 8 Drawing Sheets

PRINTED WIRING BOARD AND METHOD FOR MANUFACTURING PRINTED WIRING BOARD

CROSS-REFERENCE TO RELATED APPLICATIONS

The present application is based upon and claims the benefit of priority from Japanese Application No. 2012-213679, filed Sep. 27, 2012, the entire contents of which are incorporated herein by reference.

BACKGROUND OF THE INVENTION

1. Field of the Invention

The present invention relates to a multilayered buildup printed wiring board, and a method for manufacturing such a printed wiring board.

2. Description of Background Art

As for a multilayer wiring board in which insulating layers are built up on a core substrate, JP 2008-258335 A describes a structure in which a glass cloth is arranged more on an outer side than in a center position of an insulating layer in a thickness direction, and an amount of resin under the glass cloth is increased to fill a gap between conductive layers which are inner layers. In JP 2008-258335 A, the glass cloth in each insulating layer is arranged to be shifted from the center position. The entire contents of this publication are incorporated herein by reference.

SUMMARY OF THE INVENTION

According to one aspect of the present invention, a printed wiring board includes multiple insulating layers laminated on each other and each including a resin material and a core material impregnated with the resin material, the insulating layers having first-surface sides and second-surface sides on the opposite side of the first-surface sides, respectively, and including multiple first insulating layers and multiple second insulating layers, multiple first-surface-side conductive layers formed on the first-surface sides of the first insulating layers, respectively, multiple second-surface-side conductive layers formed on the second-surface sides of the second insulating layers, respectively. The insulating layers include one or more insulating layer having the core material positioned such that the core material of the insulating layer is shifted toward the first-surface side from the center of the insulating layer in the thickness direction of the insulating layer, the insulating layers include a central insulating layer positioned in the center of the insulating layers, and the first-surface-side conductive layers and second-surface-side conductive layers are formed such that the first-surface side conductive layers have the total area which is set smaller than the total area of the second-surface-side conductive layers.

According to one aspect of the present invention, a method for manufacturing a printed wiring board includes preparing a central insulating layer including a resin material and a core material impregnated with the resin material such that the core material is shifted toward a first surface side from the center of the central insulating layer in the thickness direction of the central insulating layer, forming a first-surface-side conductive layer on a first surface of the central insulating layer, forming a second-surface-side conductive layer on a second surface of the central insulating layer on the opposite side of the first surface of the central insulating layer, laminating on the first-surface-side conductive layer and the first surface of the central insulating layer a first insulating layer including a resin material and a core material impregnated with the resin material of the first insulting layer, laminating on the second-surface-side conductive layer and the second surface of the central insulating layer a second insulating layer including a resin material and a core material impregnated with the resin material of the second insulting layer, forming another first-surface-side conductive layer on the first insulating layer, and forming another second-surface-side conductive layer on the second insulating layer. The first-surface-side conductive layers and second-surface-side conductive layers are formed such that the first-surface-side conductive layers have the total area which is set smaller than the total area of the second-surface-side conductive layers.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
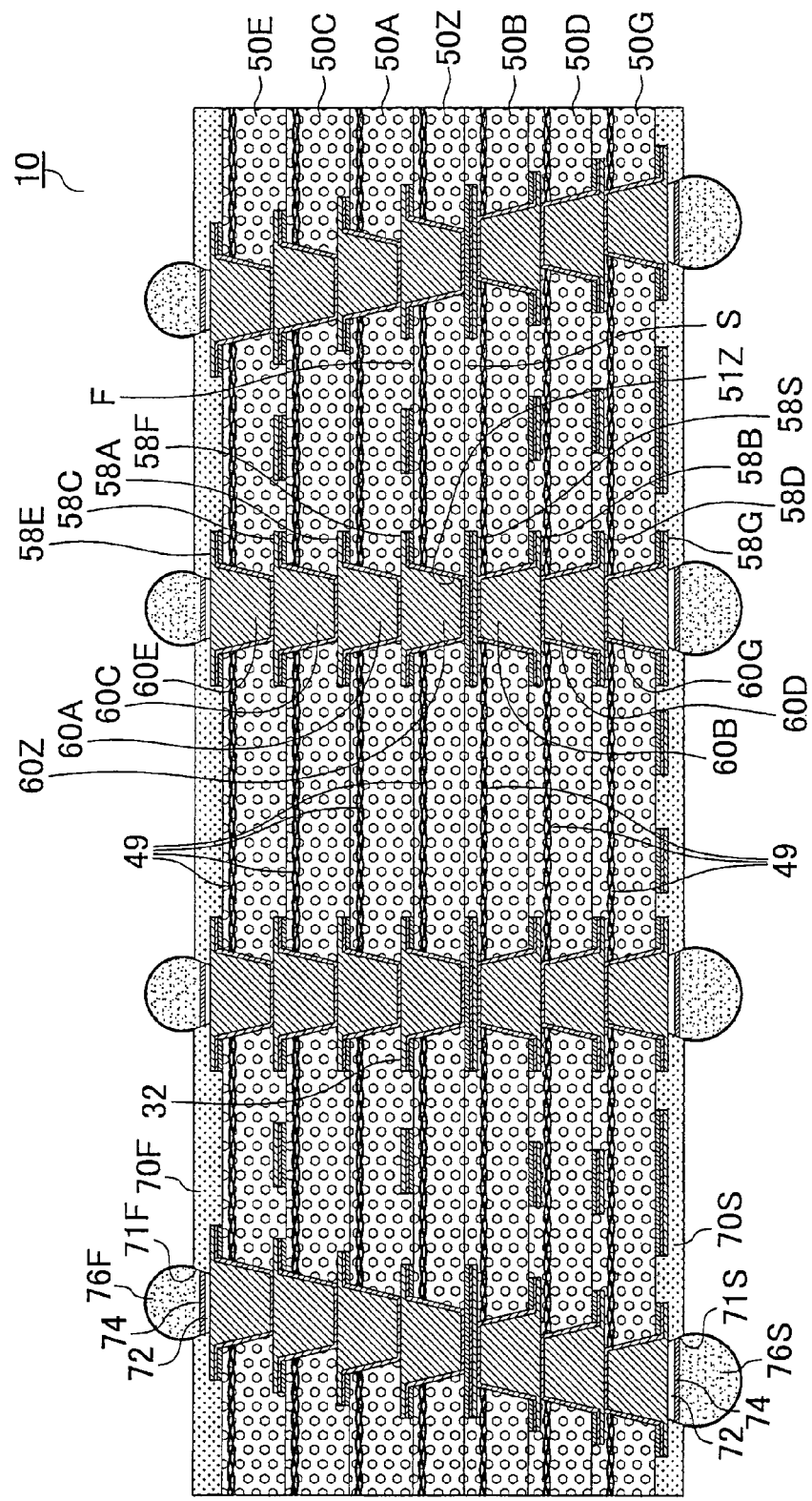
FIG. 1 is a cross-sectional view of a printed wiring board according to a first embodiment of the present invention.
Figure 2:
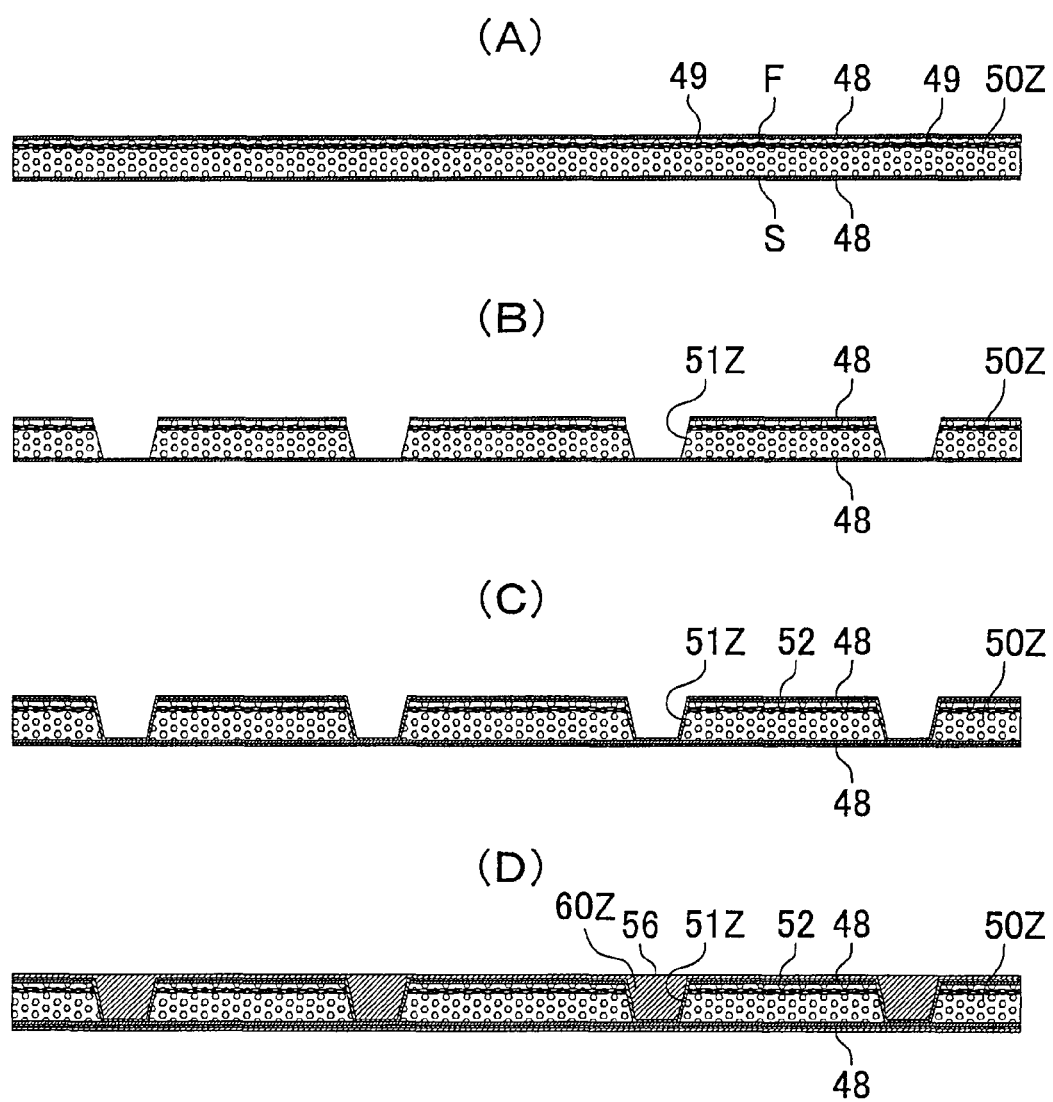
FIGS. 2A to 2D are views illustrating manufacturing processes of the printed wiring board of the first embodiment.

The embodiments will now be described with reference to the accompanying drawings, wherein like reference numerals designate corresponding or identical elements throughout the various drawings.

First Embodiment

FIG. 1 is a cross-sectional view of a printed wiring board according to a first embodiment. FIGS. 2A to 5C illustrate manufacturing processes of the printed wiring board.

A printed wiring board 10 includes a central insulating layer (50Z) disposed in a center position, first insulating layers (50A, 50C and 50E) laminated on a first-surface (F) side of the central insulating layer (50Z), and second insulating layers (50B, 50D and 50G) laminated on a second-surface (S) side of the central insulating layer (50Z). A first-surface-side conductive layer (58F) on the first surface (F) of the central insulating layer (50Z) and a second-surface-side conductive layer (58S) on the second surface (S) are connected through a via conductor (60Z). The via conductor (60Z) is formed by filling an opening (51Z) provided in the central insulating layer with copper plating. The first-surface-side conductive layer (58F) on the first surface (F) is made up of a copper foil 48 formed on the central insulating layer, an electroless plating film 52, and an electrolytic plating film 56

(see FIG. 3B). The second-surface-side conductive layer (58S) on the second-surface (S) side includes a copper foil 48 formed on the central insulating layer, an electroless plating film 52, and an electrolytic plating film 56 (see FIG. 3B). The area of the second-surface-side conductive layer (58S) is greater than the area of the first-surface-side conductive layer (58F). The first-surface-side conductive layer (58A) on the first insulating layer (50A) is made up of the copper foil 48 formed on the first insulating layer, the electroless plating film 52 and the electrolytic plating film 56 (see FIG. 4C).

A via conductor (60A) for connecting the first-surface-side conductive layer (58A) on the first insulating layer (50A) to the first-surface-side conductive layer (58F) on the central insulating layer 50Z is formed in the first insulating layer (50A) laminated on the first surface (F) of the central insulating layer (50Z). A via conductor (60C) for connecting the first-surface-side conductive layer (58C) on the first insulating layer (50C) to the first-surface-side conductive layer (58A) on the first insulating layer (50A) is formed in the first insulating layer (50C) laminated on the first insulating layer (50A). A via conductor (60E) for connecting the first-surface-side conductive layer (58E) on the first insulating layer (50E) to the first-surface-side conductive layer (58C) on the first insulating layer (50C) is formed in the first insulating layer (50E) laminated on the first insulating layer (50C).

A via conductor (60B) for connecting the second-surface-side conductive layer (58B) on the second insulating layer (50B) to the second-surface-side conductive layer (58S) on the central insulating layer (50Z) is formed in the second insulating layer (50B) laminated on the second-surface (S) side of the central insulating layer (50Z). A via conductor (60D) for connecting the second-surface-side conductive layer (58D) on the second insulating layer (50D) to the second-surface-side conductive layer (58B) on the second insulating layer (50B) is formed in the second insulating layer (50D) laminated on the second insulating layer (50B). A via conductor (60G) for connecting the second-surface-side conductive layer (58G) on the second insulating layer (50G) to the second-surface-side conductive layer (58D) on the second insulating layer (50D) is formed in the second insulating layer (50D) laminated on the second insulating layer (50D).

In the printed wiring board of the first embodiment, the total area of the first-surface-side conductive layer (58F) on the first-surface (F) side of the central insulating layer (50Z), the first-surface-side conductive layer (58A) on the first insulating layer (50A), the first-surface-side conductive layer (58C) on the first insulating layer (50C) and the first-surface-side conductive layer (58E) on the first insulating layer (50E) is smaller than the total area of the second-surface-side conductive layer (58S) on the second-surface (S) side of the central insulating layer (50Z), the second-surface-side conductive layer 58B on the second insulating layer (50B), the second-surface-side conductive layer (58D) on the second insulating layer (50D), and the second-surface-side conductive layer (58G) on the second insulating layer (50G).

Figure 6:
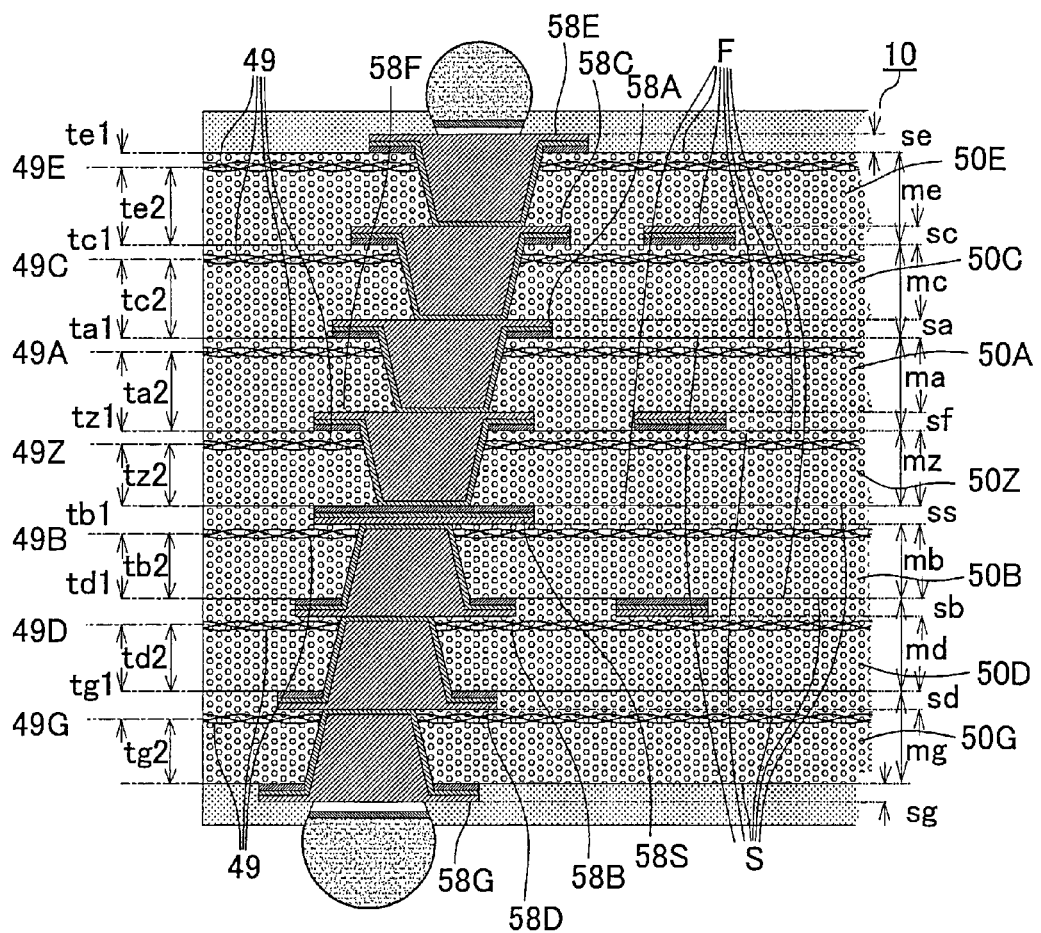
FIG. 6 is an enlarged cross-sectional view illustrating a portion of the printed wiring board of FIG. 1.

FIG. 6 is an enlarged cross-sectional view illustrating a portion of FIG. 1. A thickness (sf) of the first-surface-side conductive layer (58F), a thickness (sa) of the first-surface-side conductive layer (58A), a thickness (sc) of the first-surface-side conductive layer (58C), a thickness (se) of the first-surface-side conductive layer (58E), a thickness (ss) of the second-surface-side conductive layer (58S), a thickness (sb) of the second-surface-side conductive layer (58B), a thickness (sd) of the second-surface-side conductive layer (58D), and a thickness (sg) of the second-surface-side conductive layer (58G) are each set to be the same at 30 µm. Therefore, the remaining copper rate (conductor volume) on the upper-surface side is smaller than the remaining copper rate (conductor volume) on the lower-surface side in the printed wiring board of the first embodiment. Here, a thickness of the first-surface-side conductive layer and a thickness of the second-surface-side conductive layer are preferred to be the same in a range of 25 to 50 µm; however, that is not the only option, and conductive layers may have different thicknesses.

A thickness (mz) of the central insulating layer (50Z), a thickness (ma) of the first insulating layer (50A), a thickness (mc) of the first insulating layer (50C), a thickness (me) of the first insulating layer (50E), a thickness (mb) of the second insulating layer (50B), a thickness (md) of the second insulating layer (50D), and a thickness (mg) of the second insulating layer (50G) are each preferred to be the same at 50 µm. However, that is not the only option, and insulating layers may have different thicknesses.

The central insulating layer (50Z), the first insulating layers (50A, 50C and 50E), and the second insulating layers (50B, 50D and 50G) in the printed wiring board of the first embodiment are each formed of epoxy-based resin or thermosetting polyphenylene ether resin containing inorganic filler and are provided with a glass cloth core material 49. Although the thickness of each insulating layer is uniform in the range of 40 to 80 µm, the thickness is thinner than that of a mainstream product currently used. In each of the first insulating layers (50A, 50C and 50E) and the second insulating layers (50B, 50D and 50G), the glass cloth core material 49 is arranged to be shifted from a center position of the corresponding insulating layer in a thickness direction and to be disposed closer to the upper-surface (first-surface) side. For example, when any one insulating layer among the central insulating layer, the first insulating layers and the second insulating layers contains two sheets of glass cloth core material, the glass cloth core material 49 is arranged in a way that a distance from a center line of the glass cloth core material near the first surface to the first surface (F) is shorter than a distance from a center line of the glass cloth core material near the second surface to the second surface (S) (FIG. 6). In the printed wiring board of the first embodiment, since each insulating layer is thin, it is easier to suppress warpage attributable to a position where the glass cloth core material is disposed.

Namely, distance (tz1) from a center line (49Z) of the glass cloth core material 49 of the central insulating layer (50Z) to the first surface (F) is shorter than distance (tz2) from the center line (49Z) to the second surface (S). Distance (ta1) from the center line (49A) of the glass cloth core material 49 of the first insulating layer (50A) to the first surface (F) is shorter than distance (ta2) from the center line (49A) to the second surface (S). Distance (tc1) from the center line (49C) of the glass cloth core material 49 of the first insulating layer (50C) to the first surface (F) is shorter than distance (tc2) from the center line (49C) to the second surface (S). Distance (te1) from the center line (49E) of the glass cloth core material 49 of the first insulating layer (50E) to the first surface (F) is shorter than distance (te2) from the center line (49E) to the second surface (S). Distance (tb1) from the center line (49B) of the glass cloth core material 49 of the second insulating layer (50B) to the first surface (F) is shorter than distance (tb2) from the center line (49B) to the second surface (S). Distance (td1) from the center line (49D) of the glass cloth core material 49 of the first insulating layer (50D) to the first surface (F) is shorter than distance (td2) from the center line (49D) to the second surface (S). Distance (tg1) from the center line 49G of the glass cloth core material 49 of the first insulating layer (50G) to the first surface (F) is shorter than distance (tg2) from the center line (49G) to the second surface (S).

In the printed wiring board 10 of the first embodiment, the total area of the first-surface-side conductive layers (58F, 58A, 58C and 58E) on the upper-surface side is smaller than the total area of the second-surface-side conductive layers (58S, 58B, 58D and 58G) on the lower-surface side. Therefore, warpage may tend to occur because of the difference in the remaining copper rate between the upper surface and the lower surface. However, the glass cloth core material 49 in each of the central insulating layer (50Z), the first insulating layers (50A, 50C and 50E), and the second insulating layers (50B, 50D and 50G) is arranged to be shifted from the center in a thickness direction of the insulating layer and to be disposed closer to the first surface. Accordingly, stress is generated in each insulating layer to be exerted in a direction opposite the stress attributable to the difference in the remaining copper rate, and such stress alleviates the warpage attributable to the difference in the remaining copper rate. Accordingly, despite a difference in the remaining copper rate between the upper surface and the lower surface in a thin printed wiring board formed by laminating thin insulating layers, warpage is less likely to occur in the first embodiment.

In the printed wiring board of the first embodiment, since the sum of areas of the first-surface-side conductive layers (58F and 58A) on the upper-surface side is smaller than the sum of areas of the second-surface-side conductive layers (58S and 58B) on the lower-surface side, warpage may tend to occur due to a difference in the remaining copper rate between the upper surface and the lower surface. However, since the glass cloth core material 49 in each of the central insulating layer (50Z), the first insulating layer (50A) and the second insulating layer (50B) is arranged to be shifted from the center in a thickness direction of the corresponding insulating layer and to be disposed closer to the first surface, warpage attributable to the difference in the remaining copper rate is alleviated.

In a manufacturing process of a printed wiring board of the first embodiment, handling is easier even before a lamination process since the area of the first-surface-side conductive layer (58F) on the upper-surface side is smaller than the area of the second-surface-side conductive layer (58S) on the lower-surface side.

In the printed wiring board of the first embodiment, the via conductors (60A, 60C and 60E) tapering toward the second surface from the first surface are respectively formed in the first insulating layers (50A, 50C and 50E) laminated on the first-surface (F) side of the central insulating layer (50Z) located in the center, and the via conductors (60B, 60D and 60G) tapering toward the first surface from the second surface are respectively formed in the second insulating layers (50B, 50D and 50G) laminated on the second-surface (S) side of the central insulating layer (50Z). The warpage is reduced because of the symmetry between the via conductors (60A, 60C and 60E) on the upper side and the via conductors (60B, 60D and 60G) on the lower side.

A manufacturing method of the printed wiring board of the first embodiment is illustrated in FIGS. 2A to 5C.

(1) A double-sided copper-clad laminate is prepared as a starting material. The double-sided copper-clad laminate is formed by laminating an 8-μm-thick copper foil 48 on both surfaces of a 50-μm-thick central insulating layer (50Z) obtained by curing prepreg of epoxy-based resin containing an inorganic filler and having a glass cloth core material 49. The glass cloth core material 49 of the central insulating layer (50Z) is arranged to be shifted from the center and to be disposed closer to the first surface (F) side (FIG. 2A). First, blackening treatment is performed on the surfaces of the copper foil 48.

(2) A CO2 laser is irradiated at the first-surface (F) side of the central insulating layer (50Z) in a direction from the first surface (F) toward the second surface (S) so that the opening (51Z) is formed to reach the copper foil 48 on the second-surface side (FIG. 2B).

(3) After desmearing treatment for the opening (51Z) is performed using permanganic acid, the electroless plating film 52 is formed by an electroless plating process (FIG. 2C), and then the electrolytic plating film 56 is formed. As a result, the via conductor (60Z) obtained by filling the opening (51Z) with the plating films is formed (FIG. 2D).

(4) An etching resist 54 having a predetermined pattern is formed in the electrolytic plating film 56 formed on the surface of the central insulating layer (50Z) (FIG. 3A).

(5) The electrolytic plating film 56, the electroless plating film 52 and the copper foil 48 on the first-surface side in a region where the etching resist is not formed are removed, and the electrolytic plating film 56, the electroless plating film 52 and the copper foil 48 on the second-surface side are removed. Then, the etching resist is removed. As a result, the central insulating layer (50Z) having the first-surface-side conductive layer (58F), the second-surface-side conductive layer (58S) and the via conductor (60Z) is completed (FIG. 3B). The area of the second-surface-side conductive layer (58S) is greater than that of the first-surface-side conductive layer (58F).

(6) The first insulating layer (50A) obtained by impregnating a glass cloth core material 49 with a thermosetting polyphenylene ether-based resin, and the 8-μm-thick copper foil 48 are laminated on the first surface (F) of the central insulating layer (50Z), and the second insulating layer (50B) obtained by impregnating a glass cloth core material 49 with a thermosetting polyphenylene ether-based resin, and the 8-μm-thick copper foil 48 are laminated on the second-surface (S) side (FIG. 3C). The glass cloth core materials 49 of the first insulating layer (50A) and the second insulating layer (50B) are arranged to be shifted from the centers of the corresponding insulating layers and disposed closer to the upper-surface (first-surface) sides. Blackening treatment is performed on the copper foil 48.

(7) The CO2 laser is irradiated, so that the opening (51A) that reaches the first-surface-side conductive layer (58F) is formed in the first insulating layer (50A) and the opening (51B) that reaches the second-surface-side conductive layer (58S) is formed in the second insulating layer (50B) (FIG. 3D).

(8) After desmearing treatment for the openings (51A and 51B) is performed, the electroless plating film 52 is formed by an electroless plating process (FIG. 3E), and then the electrolytic plating film 56 is formed. As a result, the via conductors (60A and 60B) obtained by filling the openings (51A and 51B) with the plating films are formed (FIG. 4A).

(9) An etching resist 54 having a predetermined pattern is formed in the electrolytic plating film 56 on the surfaces of the first insulating layer (50A) and the second insulating layer (50B) (FIG. 4B).

(10) The electrolytic plating film 56, the electroless plating film 52 and the copper foil 48 in a region where the etching resist is not formed are removed, and then the etching resist is removed. As a result, the first-surface-side conductive layer (58A), the first insulating layer (50A) having the via conductor (60A) the second-surface-side conductive layer 58B, and the second insulating layer (50B) having the via conductor (60B) are completed (FIG. 4C).

(11) The processes of FIG. 3C to FIG. 5C are repeated, and the first-surface-side conductive layer (58C), the first insulating layer (50C) having the via conductor (60C), the second-surface-side conductive layer (58D), and the second insulating layer (50D) having the via conductor (60D) are laminated. In addition, the first-surface-side conductive layer (58E), the first insulating layer (50E) having the via conductor (60E), the second-surface-side conductive layer (58G), and the second insulating layer (50G) having the via conductor (60G) are laminated (FIG. 5A).

(12) A commercially available solder-resist composition is applied, exposed and developed, so that solder-resist layers (70F and 70S) are formed with their respective openings (71F and 71S) (FIG. 5B).

(13) A 5-µm-thick nickel plating layer 72 is formed in the openings (71F and 71S), and a 0.03-µm-thick gold plating layer 74 is formed on the nickel plating layer (FIG. 5C).

(14) Solder balls are mounted in the opening (71F) on the first-surface side and in the opening (71S) on the second-surface side and then reflowed, so that a solder bump (76F) is formed on the first-surface (upper-surface) side, and a solder bump (76S) is formed on the second-surface (lower-surface) side. Thus, the printed wiring board 10 is obtained (FIG. 1).

Second Embodiment

Figure 7:
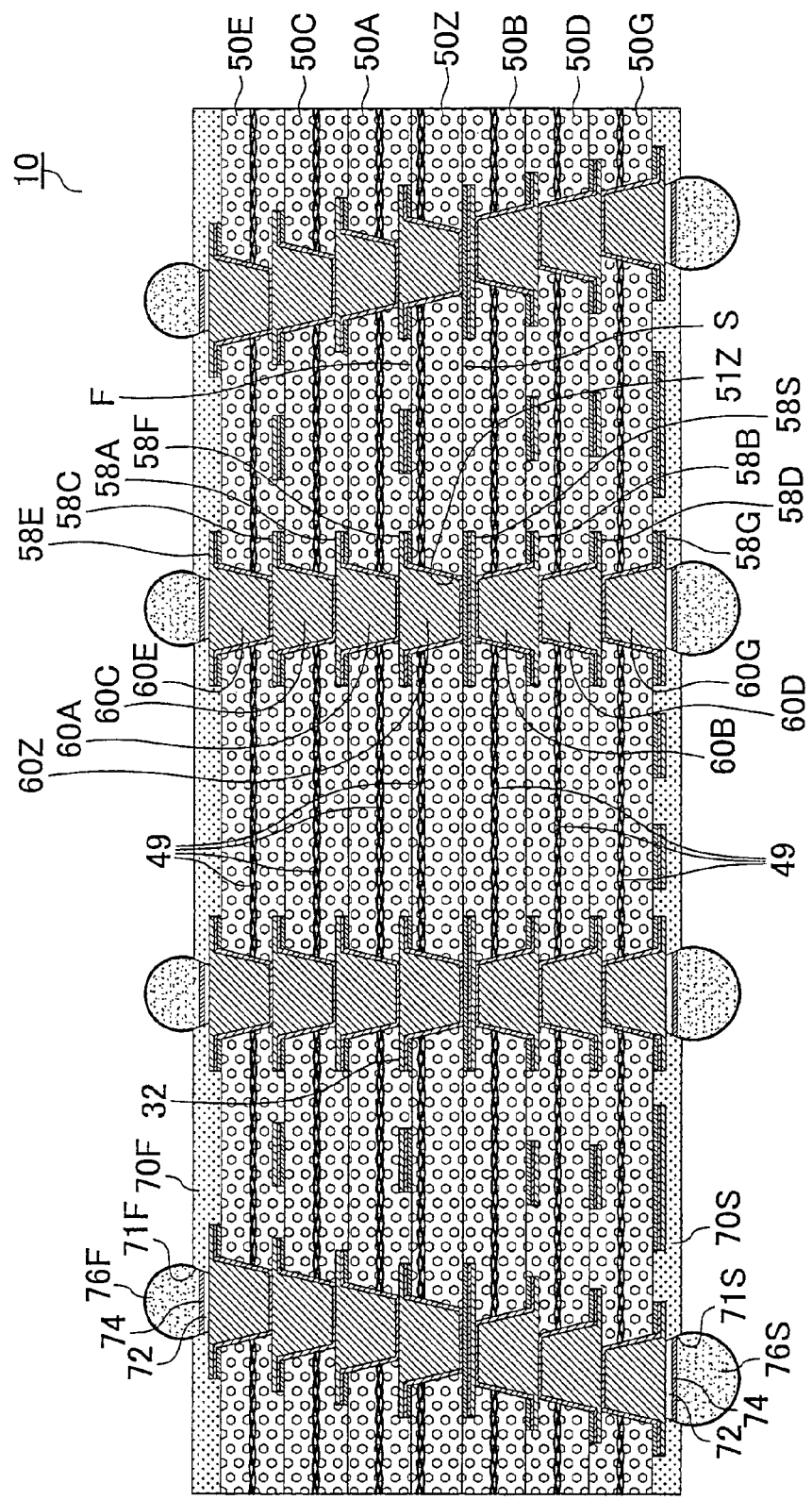
FIG. 7 is a cross-sectional view of a printed wiring board according to a second embodiment of the present invention.
Figure 8:
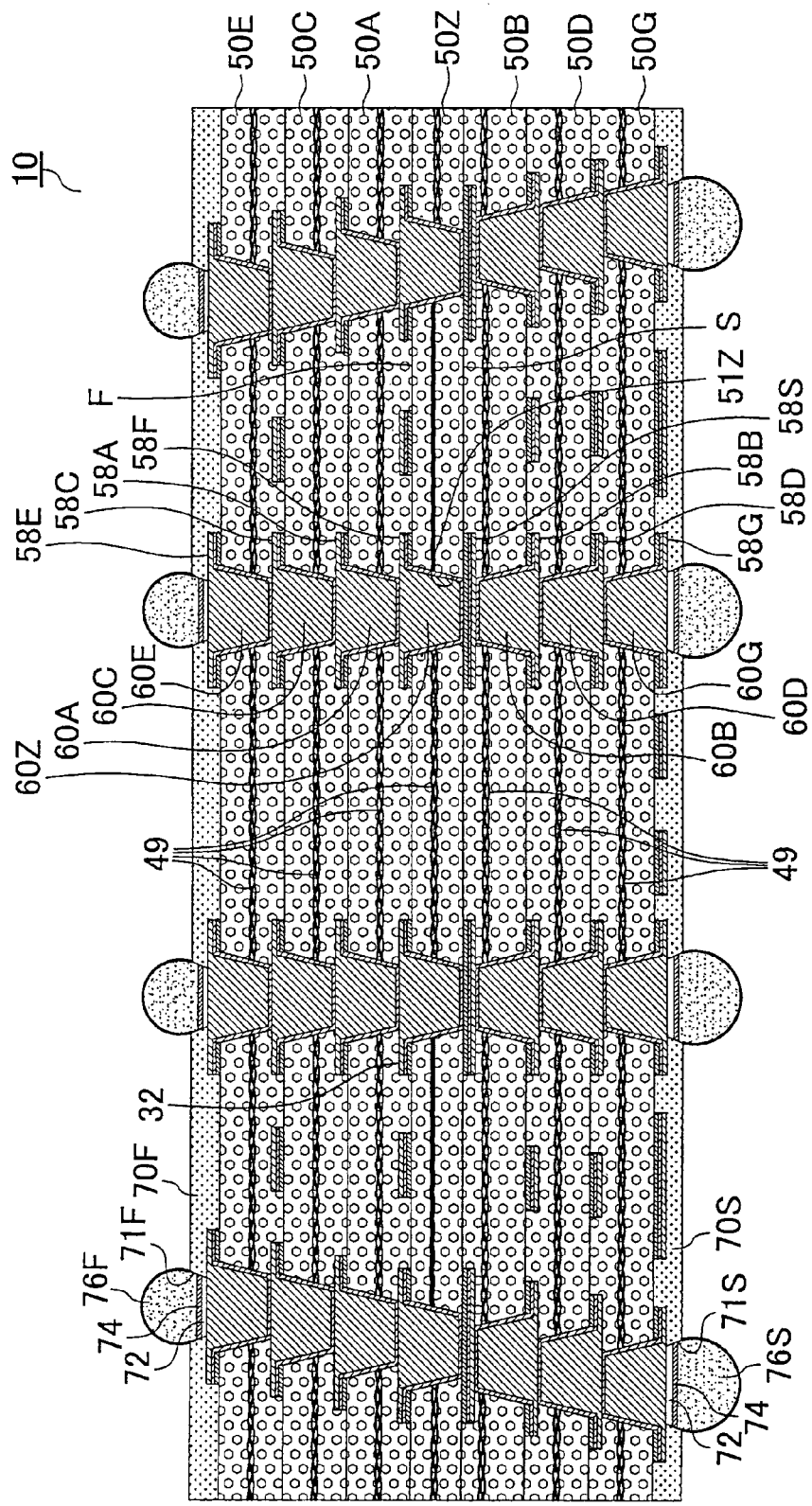
FIG. 8 is a cross-sectional view of a printed wiring board according to a third embodiment of the present invention.

FIG. 7 is a cross-sectional view of a printed wiring board according to a second embodiment.

In the printed wiring board of the second embodiment, a glass cloth core material 49 is arranged to be shifted from a center in a thickness direction and to be disposed closer to an upper-surface (first-surface) side only in a central insulating layer (50Z) positioned in the center among multiple insulating layers.

In the printed wiring board 10 of the second embodiment, the total area of first-surface-side conductive layers (58F, 58A, 58C and 58E) formed on an upper-surface side is smaller than the total area of second-surface-side conductive layers (58S, 58B, 58D and 58G) formed on a lower-surface side. Therefore, warpage may tend to occur because of a difference in the remaining copper rate between the upper-surface side and the lower-surface side. However, since the glass cloth core material 49 in the central insulating layer (50Z) is arranged to be shifted from the center of the central insulating layer in a thickness direction and to be disposed closer to the first-surface side, stress is generated in each insulating layer to be exerted in a direction opposite the stress attributable to the difference in the remaining copper rate, and such stress can alleviate the warpage attributable to the difference in the remaining copper rate.

Third Embodiment

Figure 3:
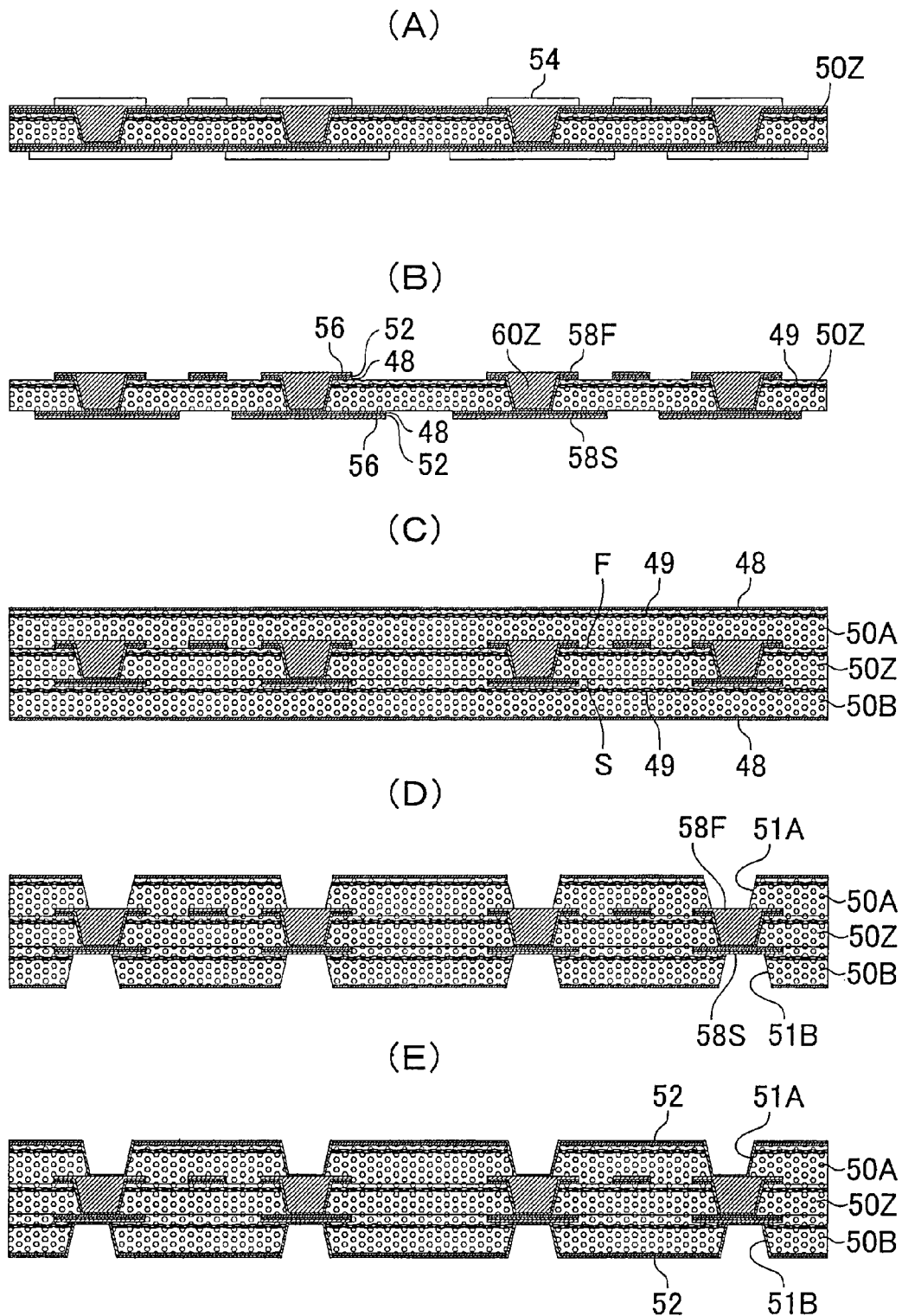
FIGS. 3A to 3E are views illustrating manufacturing processes of the printed wiring board of the first embodiment.
Figure 4:
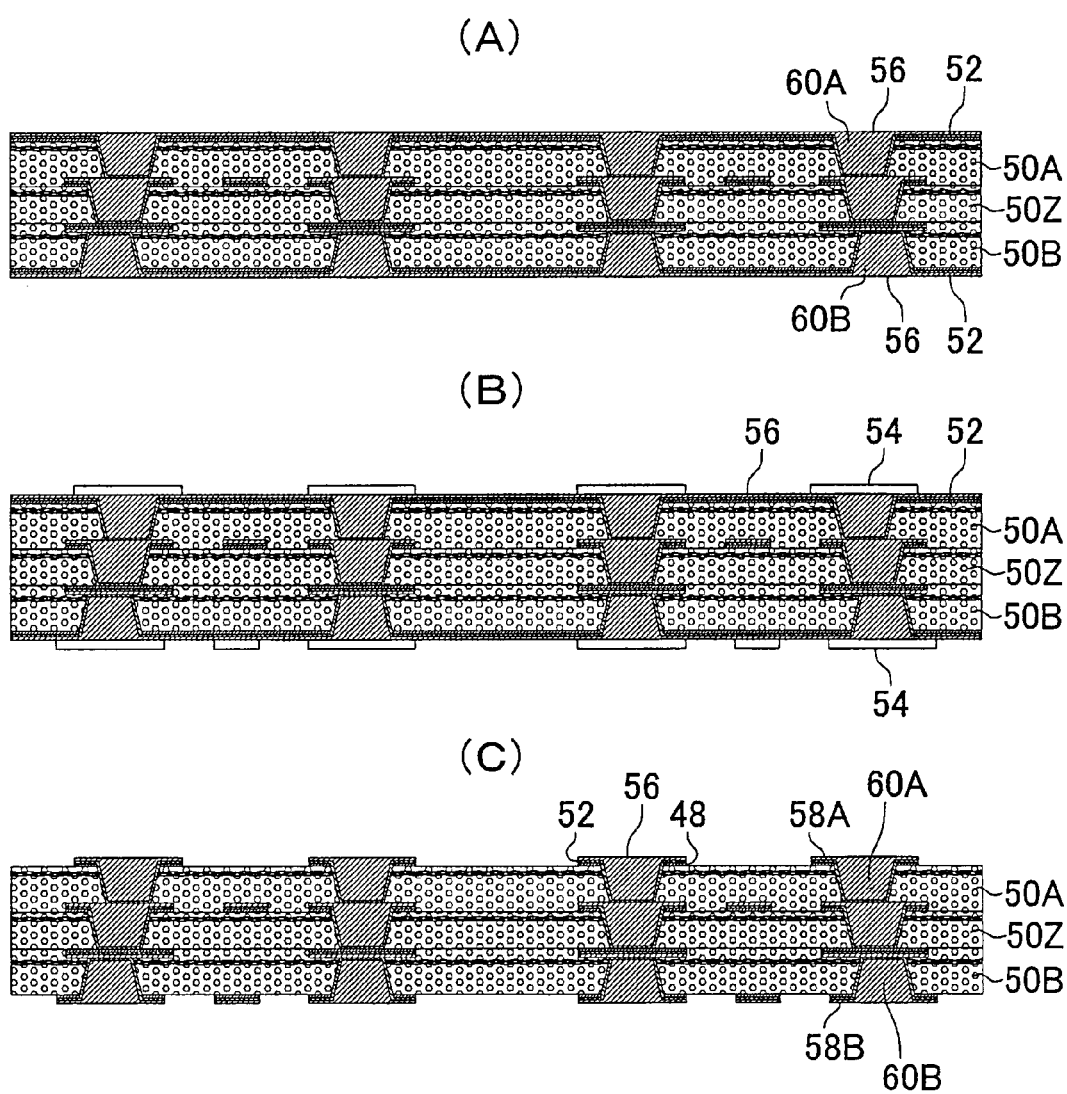
FIGS. 4A to 4C are views illustrating manufacturing processes of the printed wiring board of the first embodiment.
Figure 5:
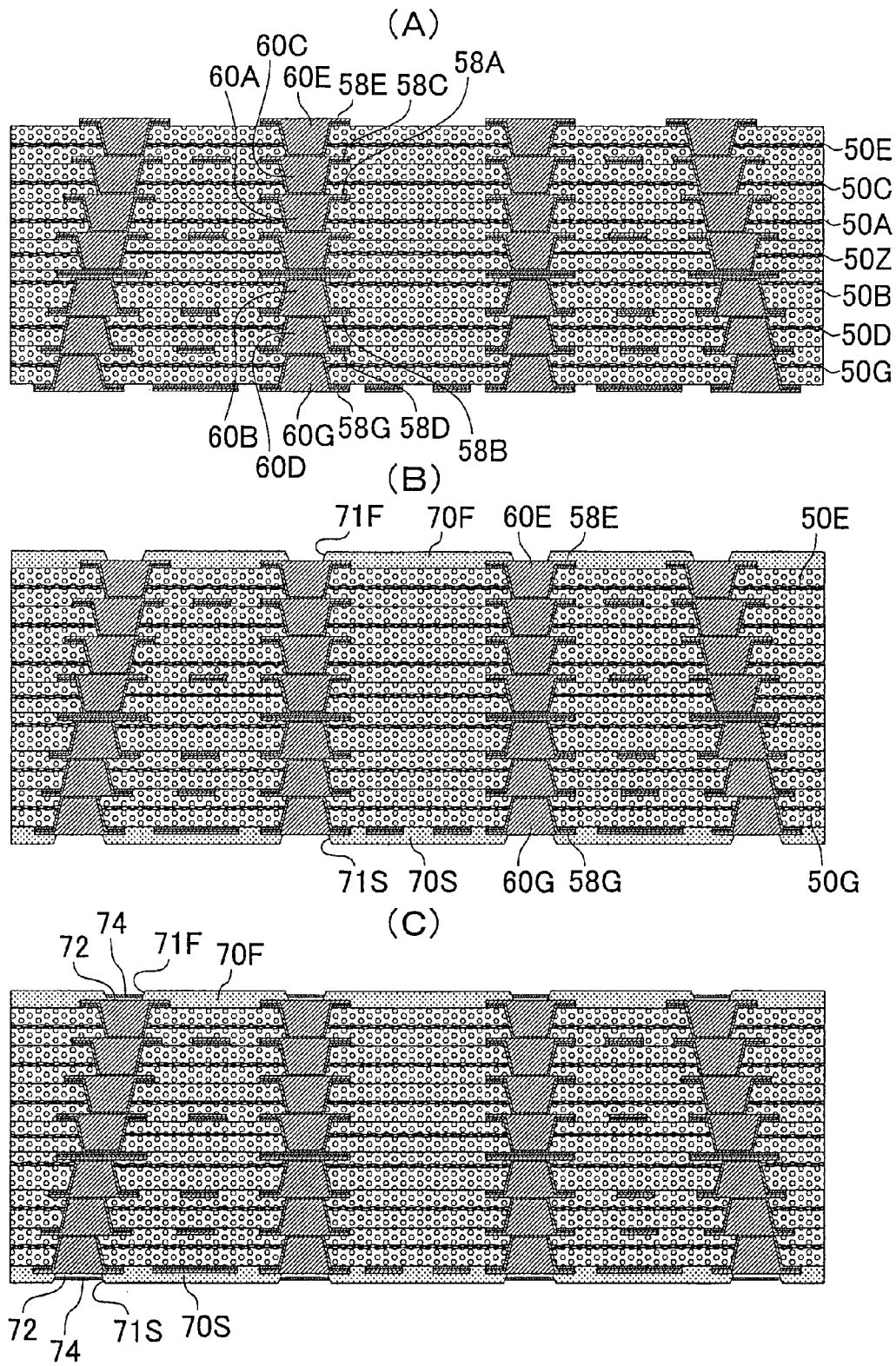
FIGS. 5A to 5C are views illustrating manufacturing processes of the printed wiring board of the first embodiment.

FIG. 3 is a cross-sectional view of a printed wiring board according to a third embodiment.

In the printed wiring board of the third embodiment, a glass cloth core material 49 is arranged to be shifted from the center in a thickness direction and to be disposed closer to an upper-surface (first-surface) side only in a second insulating layer (50B) among multiple insulating layers.

In the printed wiring board 10 of the third embodiment, the total area of first-surface-side conductive layers (58F, 58A, 58C and 58E) formed on an upper-surface side is smaller than the total area of second-surface-side conductive layers (58S, 58B, 58D and 58G) formed on a lower-surface side. For this reason, warpage may tend to occur because of a difference in the remaining copper rate between upper and lower surfaces. However, since the glass cloth core material 49 in the second insulating layer (50B) is arranged to be shifted from the center of the second insulating layer in a thickness direction and to be disposed closer to the first-surface side, stress is generated in each insulating layer to be exerted in a direction opposite the stress attributable to the difference in the remaining copper rate is generated in each insulating layer, and such stress can alleviate the warpage attributable to the difference in the remaining copper rate.

A thin printed wiring board according to an embodiment of the present invention seldom warps despite a difference in the remaining copper rate between upper and lower surfaces, and another embodiment of the present invention provides a method for manufacturing such a printed wiring board.

A printed wiring board according to one aspect of the present invention includes multiple insulating layers laminated on each other, each insulating layer having a first surface and a second surface opposite the first surface and being obtained by impregnating a core material with resin, multiple first-surface-side conductive layers formed on the their respective first-surface sides of the multiple insulating layers, and multiple second-surface-side conductive layers formed on their respective second-surface sides of multiple insulating layers. In such a printed wiring board, the core material is arranged to be shifted from the center of the corresponding insulating layer in a thickness direction and to be disposed closer to the first surface, and the total area of a conductive layer on the first-surface side of an insulating layer disposed in the center of multiple insulating layers is set smaller than the total area of a conductive layer on the second-surface side of the insulating layer disposed in the center.

In a printed wiring board according to an embodiment of the present invention, the total area of a first-surface-side conductive layer on an upper-surface side is set smaller than the total area of a second-surface-side conductive layer on a lower-surface side. Thus, due to a difference in remaining copper rate between an upper surface and a lower surface, warpage may tend to occur. However, since a core material of each insulating layer is shifted from the center in a thickness direction of the insulating layer so as to be disposed closer to the first-surface side, stress is generated in each insulating layer to be exerted in a direction opposite the stress attributable to the difference in the remaining copper rate, and such stress alleviates the warpage attributable to the difference in the remaining copper rate. Accordingly, even though the printed wiring board is thin and has a difference in a remaining copper rate between upper and lower surfaces, the printed circuit board is less likely to warp.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
a plurality of insulating layers laminated on each other and each comprising a resin material and a core material impregnated with the resin material, the plurality of insulating layers having first-surface sides and second-surface sides on an opposite side of the first-surface sides, respectively, and including a central insulating layer positioned in the center of the plurality of insulating layers, a plurality of first insulating layers laminated on a first side of the central insulating layer, and a plurality of second insulating layers laminated on a second side of the central insulating layer;

a plurality of first-surface-side conductive layers formed on the first-surface sides of the first insulating layers, respectively; and a plurality of second-surface-side conductive layers formed on the second-surface sides of the second insulating layers, respectively, wherein the plurality of first insulating layers includes at least one first insulating layer having the core material positioned such that the core material of the first insulating layer is shifted toward the first-surface side from the center of the first insulating layer in a thickness direction of the first insulating layer, the plurality of second insulating layers includes at least one second insulating layer having the core material positioned such that the core material of the second insulating layer is shifted toward the first-surface side from the center of the second insulating layer in a thickness direction of the second insulating layer, and the plurality of first-surface-side conductive layers and plurality of second-surface-side conductive layers are formed such that the plurality of first-surface side conductive layers has the total area which is set smaller than the total area of the plurality of second-surface-side conductive layers.

2. The printed wiring board according to claim 1, wherein the central insulating layer has the core material shifted toward the first-surface side from the center of the central insulating layer in a thickness direction of the central insulating layer.

3. The printed wiring board according to claim 1, wherein each of the insulating layers has the core material shifted toward the first-surface side from the center of each of the insulating layers in a thickness direction of each of the insulating layers.

4. The printed wiring board according to claim 1, wherein the central insulating layer has the first-surface-side conductive layer and the second-surface-side conductive layer, and the first-surface-side conductive layer of the central insulating layer has an area which is set smaller than an area of the second-surface-side conductive layer of the central insulating layer.

5. The printed wiring board according to claim 1, wherein each of the insulating layers has a thickness which is set to be in a range of 40 to 80 μm.

6. The printed wiring board according to claim 1, wherein each of the first-surface-side conductive layers has a thickness which is set to be in a range of 25 to 50 μm, and each of the second-surface-side conductive layers has a thickness which is set to be in a range of 25 to 50 μm.

7. The printed wiring board according to claim 1, wherein the central insulating layer has the core material shifted toward the first-surface side from the center of the central insulating layer in a thickness direction of the central insulating layer, the central insulating layer has the first-surface-side conductive layer and the second-surface-side conductive layer, and the first-surface-side conductive layer of the central insulating layer has an area which is set smaller than an area of the second-surface-side conductive layer of the central insulating layer.

8. The printed wiring board according to claim 1, wherein the central insulating layer has the core material shifted toward the first-surface side from the center of the central insulating layer in a thickness direction of the central insulating layer, and each of the insulating layers has a thickness which is set to be in a range of 40 to 80 μm.

9. The printed wiring board according to claim 1, wherein the central insulating layer has the core material shifted toward the first-surface side from the center of the central insulating layer in a thickness direction of the central insulating layer, each of the first-surface-side conductive layers has a thickness which is set to be in a range of 25 to 50 μm, and each of the second-surface-side conductive layers has a thickness which is set to be in a range of 25 to 50 μm.

10. The printed wiring board according to claim 1, wherein each of the insulating layers has a thickness which is set to be in a range of 40 to 80 μm, each of the first-surface-side conductive layers has a thickness which is set to be in a range of 25 to 50 μm, and each of the second-surface-side conductive layers has a thickness which is set to be in a range of 25 to 50 μm.

11. The printed wiring board according to claim 1, wherein the central insulating layer has the core material shifted toward the first-surface side from the center of the central insulating layer in a thickness direction of the central insulating layer, each of the insulating layers has a thickness which is set to be in a range of 40 to 80 μm, each of the first-surface-side conductive layers has a thickness which is set to be in a range of 25 to 50 μm, and each of the second-surface-side conductive layers has a thickness which is set to be in a range of 25 to 50 μm.

12. The printed wiring board according to claim 1, further comprising:

a plurality of first-surface side via conductors formed in the insulating layers laminated on the first-surface side of the central insulating layer such that the plurality of first-surface side via conductors is tapering toward the second surface of the central insulating layer; and a plurality of second-surface side via conductors formed in the insulating layers laminated on the second-surface side of the central insulating layer such that the plurality of second-surface side via conductors is tapering toward the first surface of the central insulating layer, wherein the central insulating layer has the core material shifted toward the first-surface side from the center of the central insulating layer in a thickness direction of the central insulating layer, each of the insulating layers has a thickness which is set to be in a range of 40 to 80 μm, each of the first-surface-side conductive layers has a thickness which is set to be in a range of 25 to 50 μm, and each of the second-surface-side conductive layers has a thickness which is set to be in a range of 25 to 50 μm.

13. The printed wiring board according to claim 1, further comprising:

a plurality of first-surface side via conductors formed in the insulating layers laminated on the first-surface side of the central insulating layer such that the plurality of first-surface side via conductors is tapering toward the second surface of the central insulating layer; and a plurality of second-surface side via conductors formed in the insulating layers laminated on the second-surface side of the central insulating layer such that the plurality of second-surface side via conductors is tapering toward the first surface of the central insulating layer, wherein each of the insulating layers has a thickness which is set to be in a range of 40 to 80 μm.

14. The printed wiring board according to claim 1, further comprising:

a plurality of first-surface side via conductors formed in the insulating layers laminated on the first-surface side of the central insulating layer such that the plurality of first-surface side via conductors is tapering toward the second surface of the central insulating layer; and a plurality of second-surface side via conductors formed in the insulating layers laminated on the second-surface side of the central insulating layer such that the plurality of second-surface side via conductors is tapering toward the first surface of the central insulating layer,
wherein each of the insulating layers has a thickness which is set to be in a range of 40 to 80 µm, each of the first-surface-side conductive layers has a thickness which is set to be in a range of 25 to 50 µm, and each of the second-surface-side conductive layers has a thickness which is set to be in a range of 25 to 50 µm.

15. The printed wiring board according to claim 1, wherein each of the insulating layers has the core material shifted toward the first-surface side from the center of each of the insulating layers in a thickness direction of each of the insulating layers, the central insulating layer has the first-surface-side conductive layer and the second-surface-side conductive layer, and the first-surface-side conductive layer of the central insulating layer has an area which is set smaller than an area of the second-surface-side conductive layer of the central insulating layer.

16. The printed wiring board according to claim 2, further comprising:
    a plurality of first-surface side via conductors formed in the insulating layers laminated on the first-surface side of the central insulating layer such that the plurality of first-surface side via conductors is tapering toward the second surface of the central insulating layer; and
    a plurality of second-surface side via conductors formed in the insulating layers laminated on the second-surface side of the central insulating layer such that the plurality of second-surface side via conductors is tapering toward the first surface of the central insulating layer.

17. A method for manufacturing a printed wiring board, comprising:
    preparing a central insulating layer comprising a resin material and a core material impregnated with the resin material such that the core material is shifted toward a first surface side from the center of the central insulating layer in a thickness direction of the central insulating layer;
    forming a first-surface-side conductive layer on a first surface of the central insulating layer;
    forming a second-surface-side conductive layer on a second surface of the central insulating layer on an opposite side of the first surface of the central insulating layer;
    laminating on the first-surface-side conductive layer and the first surface of the central insulating layer a first insulating layer comprising a resin material and a core material impregnated with the resin material of the first insulting layer;
    laminating on the second-surface-side conductive layer and the second surface of the central insulating layer a second insulating layer comprising a resin material and a core material impregnated with the resin material of the second insulting layer;
    forming another first-surface-side conductive layer on the first insulting layer; and
    forming another second-surface-side conductive layer on the second insulting layer,
    wherein the first-surface-side conductive layers and second-surface-side conductive layers are formed such that the first-surface-side conductive layers have the total area which is set smaller than the total area of the second-surface-side conductive layers, the core material of the first insulating layer is formed such that the core material of the first insulating layer is shifted from the center of the first insulating layer toward the first-surface-side conductive layer formed on the first insulting layer, and the core material of the second insulating layer is formed such that the core material of the second insulating layer is shifted from the center of the second insulating layer toward the second-surface-side conductive layer formed on the central insulting layer.

18. The method for manufacturing a printed wiring board according to claim 17, further comprising:
    forming on the first insulating layer another insulating layer having another first-surface-side conductive layer; and
    forming on the second insulating layer another insulating layer having another second-surface-side conductive layer,
    wherein the first-surface-side conductive layers and second-surface-side conductive layers are formed such that the first-surface-side conductive layers has the total area which is set smaller than the total area of the second-surface-side conductive layers.

19. The method for manufacturing a printed wiring board according to claim 17, wherein each of the central, first and second insulating layers has a thickness which is set to be in a range of 40 to 80 µm.

20. The method for manufacturing a printed wiring board according to claim 17, wherein each of the first-surface-side conductive layers has a thickness which is set to be in a range of 25 to 50 µm, and each of the second-surface-side conductive layers has a thickness which is set to be in a range of 25 to 50 µm.

* * * * *